(12) United States Patent
Royster

(10) Patent No.: US 9,118,024 B2
(45) Date of Patent: Aug. 25, 2015

(54) ELECTROLUMINESCENT DEVICES HAVING A COLOR EMITTING GALIUM COMPLEX

(71) Applicant: Tommie Royster, Webster, NY (US)

(72) Inventor: Tommie Royster, Webster, NY (US)

( * ) Notice: Subject to any disclaimer, the term of this patent is extended or adjusted under 35 U.S.C. 154(b) by 0 days.

(21) Appl. No.: 14/212,776

(22) Filed: Mar. 14, 2014

(65) Prior Publication Data

US 2015/0014654 A1    Jan. 15, 2015

Related U.S. Application Data

(60) Provisional application No. 61/781,881, filed on Mar. 14, 2013.

(51) Int. Cl.
*H01L 51/00* (2006.01)
*H01L 51/50* (2006.01)

(52) U.S. Cl.
CPC ......... *H01L 51/0082* (2013.01); *H01L 51/0062* (2013.01); *H01L 51/0067* (2013.01); *H01L 51/0072* (2013.01); *H01L 51/5012* (2013.01)

(58) Field of Classification Search
CPC ............ H01L 51/0062; H01L 51/0067; H01L 51/0072; H01L 51/5012; H01L 51/0082
See application file for complete search history.

(56) References Cited

U.S. PATENT DOCUMENTS

| | | | | |
|---|---|---|---|---|
| 7,442,760 B2* | 10/2008 | Roberts et al. | ................ | 528/423 |
| 7,956,206 B2* | 6/2011 | Watkins | .......................... | 556/21 |
| 8,067,265 B2* | 11/2011 | Zheng et al. | .................... | 438/99 |
| 8,440,325 B2* | 5/2013 | McKiernan et al. | .......... | 428/690 |
| 8,878,163 B2* | 11/2014 | Conway et al. | ................. | 257/40 |
| 2007/0107835 A1* | 5/2007 | Roberts et al. | ................ | 156/230 |
| 2007/0282076 A1* | 12/2007 | Bold et al. | ..................... | 525/370 |
| 2008/0026135 A1* | 1/2008 | Bentsen et al. | ................. | 427/66 |
| 2009/0115327 A1* | 5/2009 | Nazeeruddin et al. | ........ | 313/504 |
| 2009/0200920 A1* | 8/2009 | Jin et al. | ........................ | 313/504 |
| 2011/0050093 A1* | 3/2011 | Fukuzaki | ...................... | 313/504 |

* cited by examiner

*Primary Examiner* — Ida M Soward
(74) *Attorney, Agent, or Firm* — John M. Hammond; Patent Innovations LLC

(57) ABSTRACT

The present disclosure provides an electroluminescent device including a light-emitting layer containing a blue or a blue-green fluorescent light emitting material that contains a dialkyl-gallium moiety coordinated to a bidentate nitrogen bonding chelating ligand to form a gallium containing 6-membered heteroatom ring. The invention also provides a display or area lighting device including the OLED device, a process for emitting light, and a dialkyl-gallium chelate complex. The device provides unexpected and useful light emissions in the blue and green regions of the visible spectrum.

4 Claims, 6 Drawing Sheets

Inv. 2

Inv. 3

Inv. 4

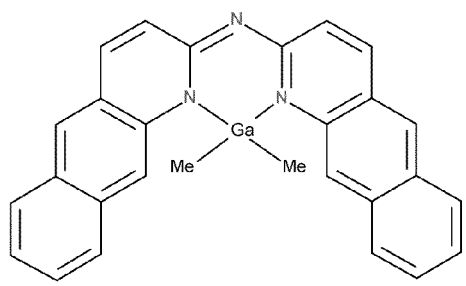
FIG. 13 Inv. 5
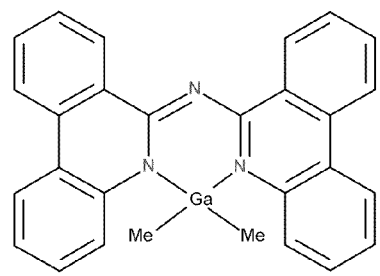
FIG. 14 Inv. 6
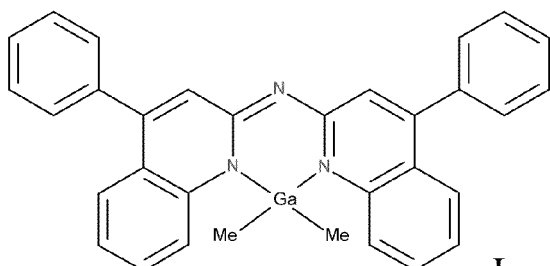
FIG. 15 Inv. 7
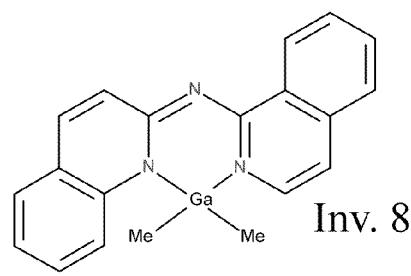
FIG. 16 Inv. 8

Inv. 2

ELECTROLUMINESCENT DEVICES HAVING A COLOR EMITTING GALIUM COMPLEX

CROSS-REFERENCE TO RELATED APPLICATIONS

This application claims priority to U.S. Provisional Patent Application Ser. No. 61/781,881, filed on Mar. 14, 2013, which are hereby incorporated by reference in its entirety. Other related applications having common inventorship and/or ownership as may mentioned throughout this disclosure, are also incorporated by reference in their entirety.

FIELD

The disclosed subject matter relates generally to systems and methods for producing electroluminescent devices and, in particular, to organic light emitting diode (OLED) devices and structures and processes relating thereto.

DESCRIPTION OF THE RELATED ART

Since the first demonstration of electroluminescence from a device comprised of an organic thin-film placed between two electrodes, organic light emitting diode technology has advanced by using multiple organic layers to produce light more efficiently. The basic structure of an OLED device is shown in FIG. 1. Injection of holes and electrons from the anode and cathode respectively result in light emission through recombination of the holes and electrons in the emissive layer of the organic stack. Organic thin films are typically less than 50 nm in thickness resulting in low voltage operations and potential to produce low power consuming devices.

The most technology challenging aspect of OLED technology remains the performance of the blue lighting materials that are available. Although progress has been recorded, the need for more advanced blue materials is required to advance device color, efficiency and lifetime.

Blue and blue-green fluorescent emitters can by be divided into two categories: pure aromatic organic compounds and metal-chelate compounds. Examples of pure organic aromatic blue emitters include perylene shown in FIG. 2. Alkyl or aryl substituted perylene compounds are known and the compound 2,5,8,11 tetra-t-butyl perylene is considered a desirable blue emitter for OLED application.

Another class of blue and blue-green aromatic fluorescent materials is distyrylarenes. Specific examples are distyrylbenzene and distyrylbiphenylene are illustrated in FIGS. 3 and 4. These materials are further described in U.S. Pat. No. 5,121,029.

A class of blue emitter materials has been established that incorporates the Group VIII non-metal element boron; U.S. Pat. No. 6,661,023. The materials are prepared through the coordination of boron to chelating amine groups to form a 6-membered heteroatom rings. Examples of the boron containing blue emitters are represented in FIGS. 5 and 6.

Examples of blue-green emitting main-group metal-chelate materials are represented by the Zn-chelate complex appear in FIG. 7.

SUMMARY

The present disclosure provides an electroluminescent device comprising a light-emitting layer containing a blue or a blue-green fluorescent light emitting material that is comprised of a dialkyl-gallium moiety coordinated to a bidentate nitrogen bonding chelating ligand to form a gallium containing 6-membered heteroatom ring. The invention also provides a display or area lighting device including the OLED device, a process for emitting light, and a dialkyl-gallium chelate complex. The device provides unexpected and useful light emissions in the blue and green regions of the visible spectrum.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features, and advantages here provided will become apparent to one with skill in the art upon examination of the following FIGURES and detailed description. It is intended that all such additional systems, methods, features and advantages be included within this description, be within the scope of the accompanying claims.

BRIEF DESCRIPTION OF THE DRAWINGS

The novel features believed characteristic of the disclosed subject matter will be set forth in claims that follow. The disclosed subject matter itself, however, as well as a preferred mode of use, further objectives, and advantages thereof, will best be understood by reference to the following detailed description of an illustrative embodiment when read in conjunction with the accompanying drawings, wherein:

FIG. 13 depicts an illustrative example of the chemical structure of Inv. 5.

FIG. 14 depicts an illustrative example of the chemical structure of Inv. 6.

FIG. 15 depicts an illustrative example of the chemical structure of Inv. 7.

FIG. 16 depicts an illustrative example of the chemical structure of Inv. 8.

DETAILED DESCRIPTION OF THE SPECIFIC EMBODIMENTS

Figure 1:
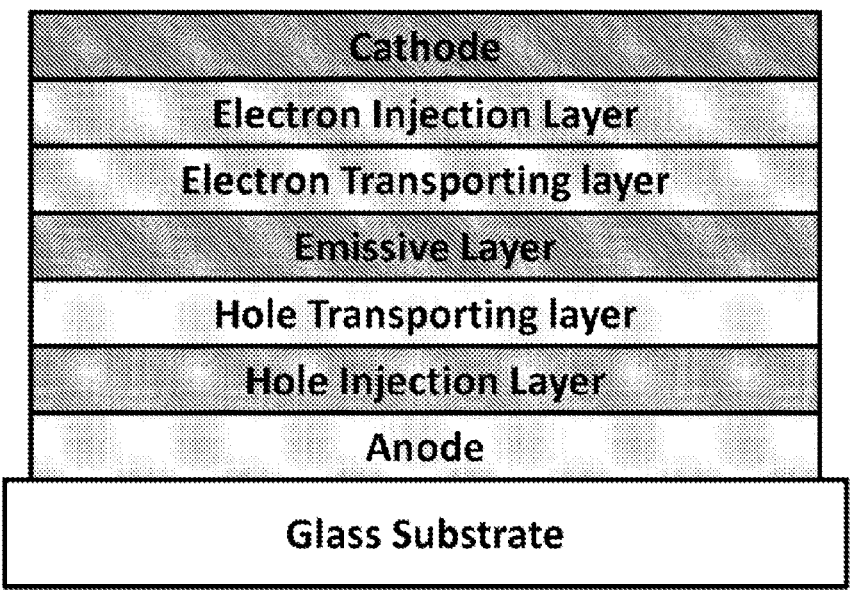
FIG. 1 depicts the basic structure of an OLED device.
Figure 2:
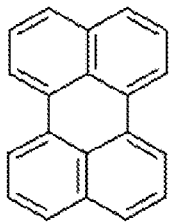
FIG. 2 depicts the chemical structure of perylene, an exemplary pure organic aromatic blue emitter.
Figure 3:
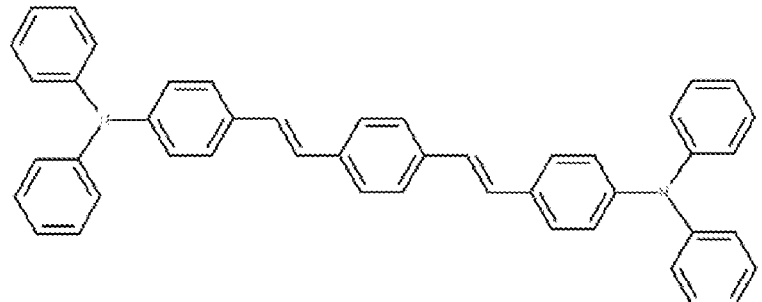
FIG. 3 depicts the chemical structure of distryrylbenzene, which is an exemplary member of the class of blue and blue-green aromatic fluorescent materials known as distyrylarenes.
Figure 4:
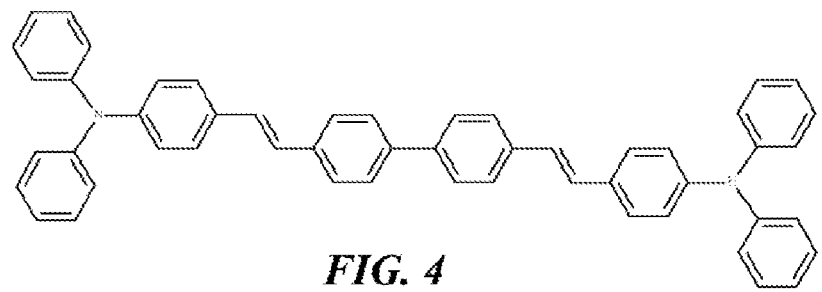
FIG. 4 depicts the chemical structure of distyrylbiphenylene, which is a member of the class of blue and blue-green aromatic fluorescent materials known as distyrylarenes.
Figure 5:
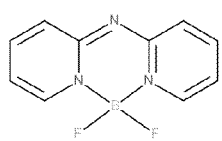
FIG. 5 depicts the chemical structure of an exemplary boron containing blue emitter.
Figure 6:
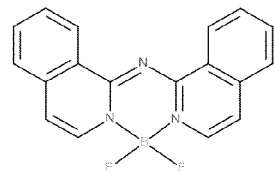
FIG. 6 depicts the chemical structure of an exemplary boron containing blue emitter
Figure 7:
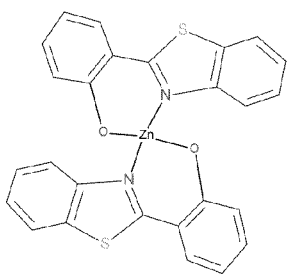
FIG. 7 depicts the chemical structure of a Zn-chelate complex, an exemplary blue-green emitting main-group metal-chelate material.
Figure 8:
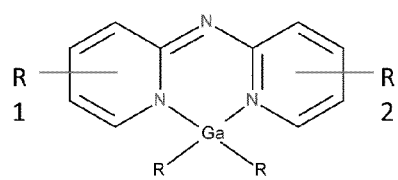
FIG. 8 represents the general structure of the invention, wherein R is an alkyl group and R1 and R2 are alkyl, aryl or fused ring groups.

The invention is generally described above. The invention provides a new class of blue and blue-green light emitting materials comprised of a 6-membered heteroatom ring that incorporates the Group VIII gallium metal and nitrogen. The materials are formed through reactions between mixed ligand organometallic gallium compounds and nitrogen chelating amine compounds. The general structure of the invention is represented by FIG. 8 where R=an alkyl group and R1 and R2=alkyl, aryl or fused ring groups. The chelating ligand has an overall negative charge and forms a six member ring structure with gallium. Coordination to the gallium metal center occurs through two nitrogen atoms that are part of the aryl groups.

Figure 9:
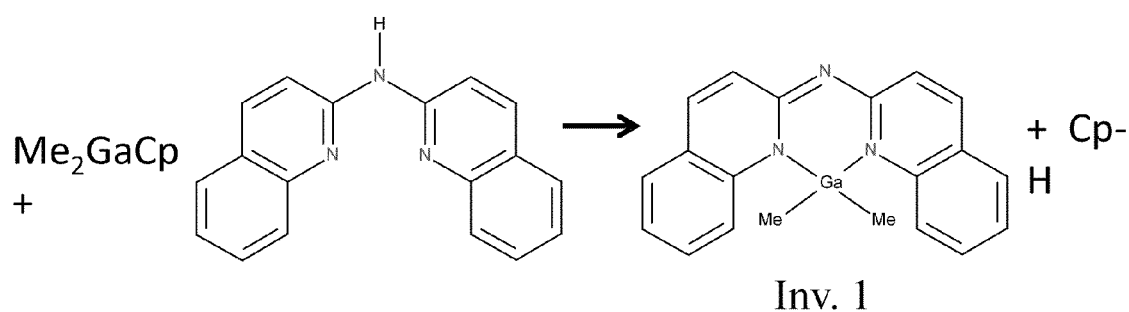
FIG. 9 shows a chemical reaction scheme that may be used to prepare Inv. 1.

In one embodiment, FIG. 9, the following reaction scheme is used to prepare Inv. 1.

Figure 10:
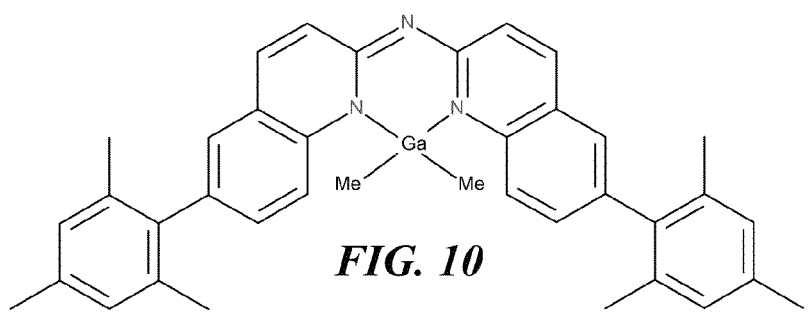
FIG. 10 shows an exemplary embodiment of Inv. 2, wherein the chelating amine ligand includes an aryl group bonded to an isoquinoline group.
Figure 11:
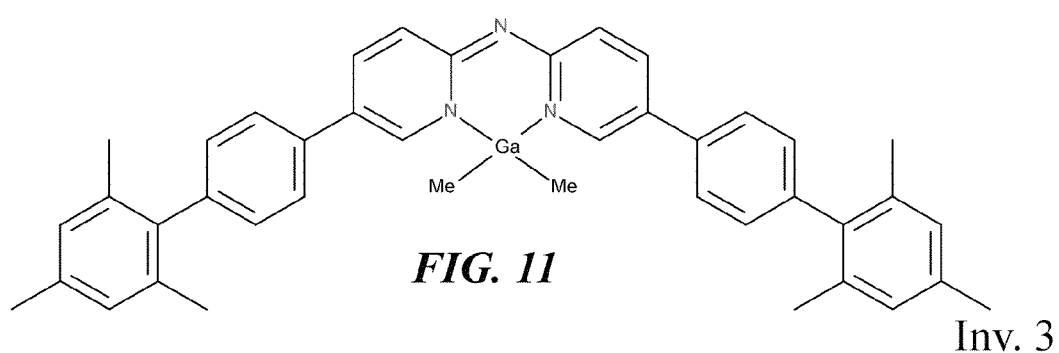
FIG. 11 depicts an illustrative example of the chemical structure of Inv. 3.
Figure 12:
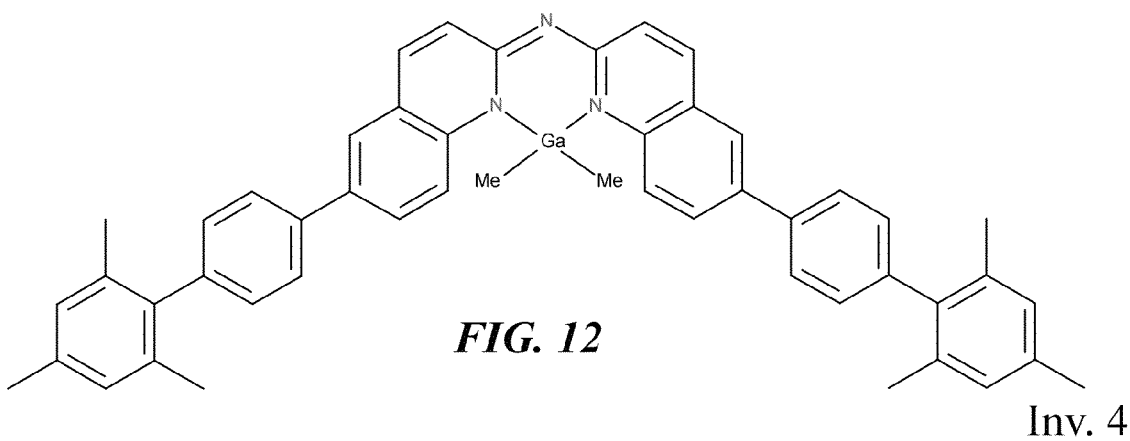
FIG. 12 depicts an illustrative example of the chemical structure of Inv. 4.

In one desirable embodiment the chelating amine ligand includes an aryl group bonded to an isoquinoline group as indicated in by Inv. 2 shown in FIG. 10.

Additional and useful illustrative examples of the invention are provided in FIGS. 11 through 16 as Inv. 3 through 8.

Figure 17:
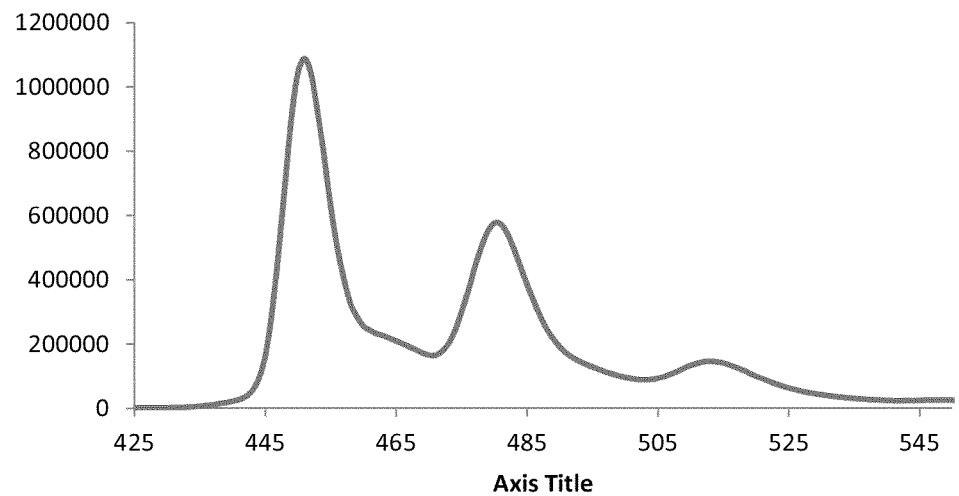
FIG. 17 shows the enhanced or extra emission band observed for Inv. 1.
Figure 18:
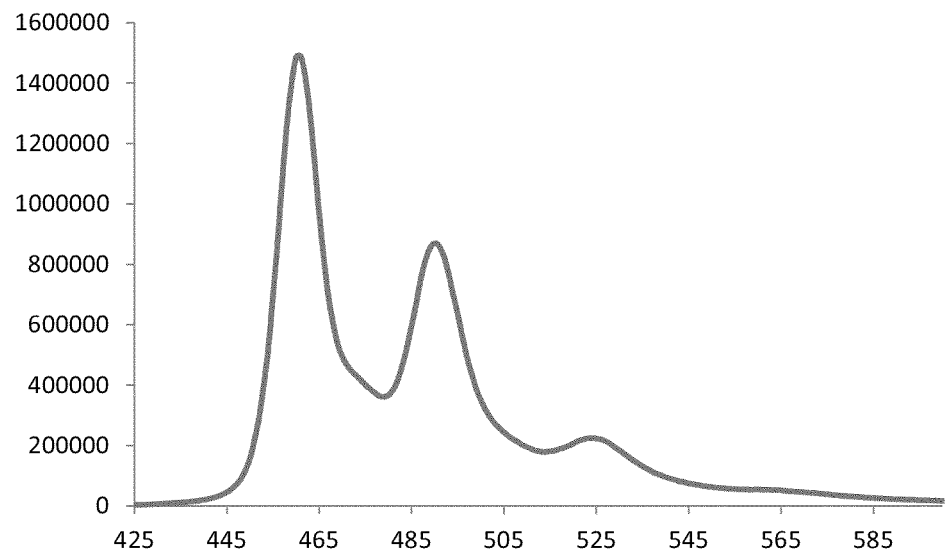
FIG. 18 shows the enhanced or extra emission band observed for Inv. 2.

Photoluminescence studies show that coordination of the amine ligands to the metal center of the dimethyl-gallium moiety enhances the higher wavelength vibrational emission bands. This is not the case for the well-studied boron complexes and other blue or blue-green emitters. The higher wavelength emission bands are not observed in the other emitters indicating energy loss through non-radiative processes. FIGS. 17 and 18 show the enhanced or extra emission bands observed for Inv. 1 and Inv. 2. This positions the gallium complexes for improve efficiency with respect to OLED device applications. The extra emission bands can be especially useful for solid-state lighting applications where it is desirable to have light emission across the light region.

The invention provides an electroluminescent device comprising a light-emitting layer that incorporates the new blue or blue-green emitting gallium complex. The gallium complex is comprised of a dialkyl-gallium moiety coordinated to a bidentate nitrogen bonding chelating ligand to form a gallium containing 6-membered heteroatom ring. The light emitting layer is placed between a pair of electrodes, an anode and a cathode In one embodiment, the emissive layer containing the light emitting gallium complex is contiguous to a hole-transporting layer and an electron transporting layer with all layers placed between two electrodes.

In another embodiment, the device contains two emissive layers with one layer containing the light emitting gallium complex.

In a preferred embodiment, the device contain two or more emissive layers to produce white light with at least one layer containing the light emitting gallium complex.

The example of forming Inv. 1 of FIG. 9 may be as follows. In a glove box, a clean, oven-dried 500 mL Schlenk flask was charged with dimethyl-gallium organometllic precursor (30.3 mmol). The flask was equipped with a stirbar, sealed with a septum, and removed from the glove box. The CpGaMe2 flask was attached to a Schlenk line and put under an N2 atmosphere. The precursor was then slurried in 250 mL anhydrous toluene added via cannula. The mixture was stirred forming a light-yellow, homogeneous solution.

Separately, a 1-L, 3-neck, RB flask was equipped with a reflux condenser, gas-adapter, and a stirbar. The 3rd neck of the flask was sealed with a septum. The 1-L flask and condenser setup was then pump/purged 4× to establish an inert atmosphere. The septum from the 1-L flask was removed and the flask charged with N-2-quinolinyl-2-quinolinamine (8.23 g, 30.3 mmol) under an N2 counter-flow. The reaction vessel was again pump/purged 3× to re-establish an inert atmosphere.

The precursor/toluene solution was then rapidly delivered to the quinolamine flask via cannula. The light-yellow solution immediately took on a dark-orange hue. The resulting mixture was then stirred at room temperature for 90 minutes (estimated 10-20% of the quinolamine remained undissolved). The reaction vessel was wrapped in aluminum foil to prevent photolysis.

After stirring for 90 minutes, the reaction mixture had changed to a light-orange, nearly homogenous solution. The reaction vessel was placed in an oil bath and the bath heated to 125° C. The reaction mixture was then refluxed for 5 hours. The heat to the oil bath was turned off and the reaction mixture was allowed to cool to room temperature. Upon cooling, the reaction mixture consisted of a bright-yellow solution atop a dark-yellow/brownish precipitate. The reaction mixture was then concentrated to ca. 50% of its original volume under reduced pressure. 125 mL of anhydrous hexane was added to the slurry via cannula to induce further precipitation of the desired product. The resulting mixture was stirred for an additional 20 minutes. Stirring was then ceased and the precipitate was allowed to settle. The supernatant was then filtered away from the solid product using a cannula filter.

The solids were washed 2× with 125 mL anhydrous pentane. The volatiles were then removed under reduced pressure to a level <0.5 Torr. 6.9 g (19 mmol, 62% yield) of a bright-yellow solid was isolated in the glove box. Purity by 1H NMR was estimated to be 98+%.

Figure 19:
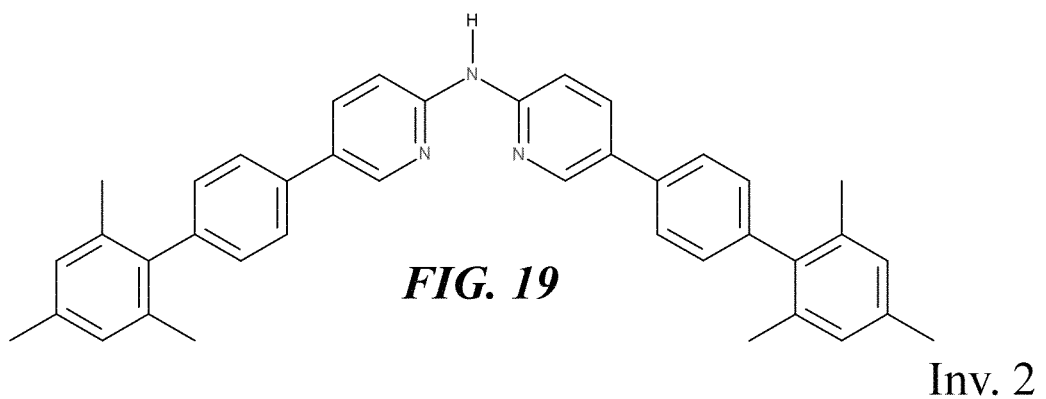
FIG. 19 shows an illustrative example of the chemical structure of Inv. 2.

The example of Inv. 2 in FIG. 19 may be synthesized as here described. A similar process was used as outlined in Example 1 with the exceptions of replacing N-2-quinolinyl-2-quinolinamine with the following chelating ligand and combing the reactants inside of a glove box.

Figure 20:
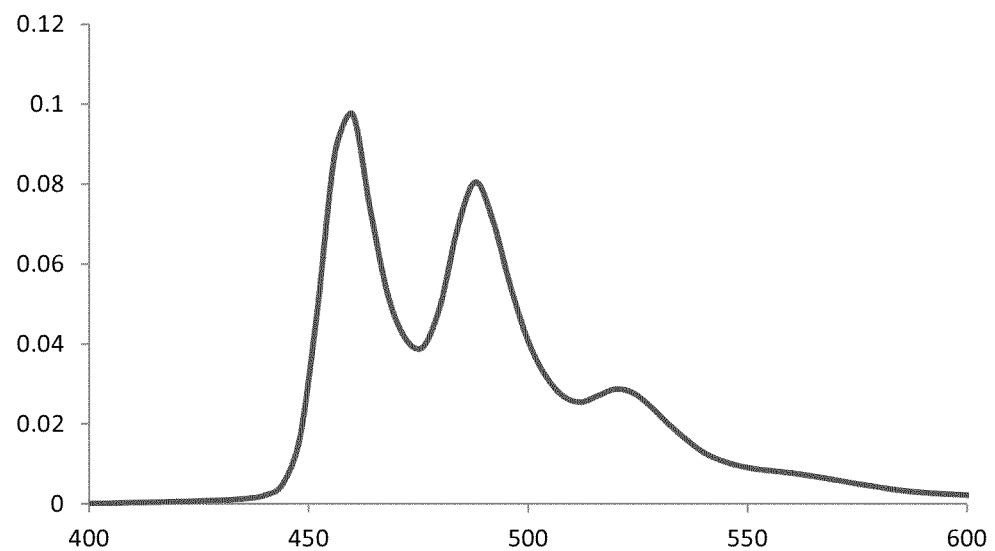
FIG. 20 shows the electroluminescence spectrum of OLED device incorporating Inv. 1.

Device Fabrication employing the present teachings may take places as here described. A glass substrate coated with about a 21.5 nm layer of indium-tin oxide (ITO), as the anode, was sequentially washed in a commercial detergent, rinsed in deionized water, rinsed with acetone and exposed to an oxygen-plasma for about 1 min. Over the ITO, a 10 nm thick hole-injecting layer (HIL) was vapor deposited. Next, a layer of a Hole Transporting Material (HTL) was deposited to a thickness of 75 nm. A 40 nm light-emitting layer (LEL) corresponding to a anthracene host material at 98% and Inv. 1 at 2% of the light-emitting material was then deposited. An electron-transporting layer (ETL) corresponding to 15 nm of tris(8-quinolinolato)aluminum(III) (Alq) was vacuum-deposited over the LEL. A 0.5 nm electron-injecting layer of lithium fluoride was vacuum deposited onto the ETL, followed by a 150 nm layer of aluminum, to form a cathode layer. The electroluminescence spectrum recorded from the device is shown in FIG. 20, which shows the electroluminescence spectrum of OLED device incorporating Inv. 1. The spectrum features were consistent with the photoluminescence spectrum.

Device fabrication for Inv. 1 of FIG. 20, Example 4 is a similar process as described in Example 3 with the exception of replacing Inv. 1 with Inv. 2. The electroluminescence spectrum was also consistent with the photoluminescence spectrum.

The foregoing description of the preferred embodiments, therefore, is provided to enable any person skilled in the art to make or use the claimed subject matter. Thus, the claimed subject matter is not intended to be limited to the embodiments shown herein but is to be accorded the widest scope consistent with the principles and novel features disclosed herein.

What is claimed is:

1. An electroluminescent device comprising a light-emitting layer incorporating a blue or blue-green emitting gallium complex, said gallium complex comprising a dialkyl-gallium moiety coordinated to a bidentate nitrogen bonding chelating ligand to form a gallium containing 6-membered heteroatom ring, wherein said light emitting layer is placed between a pair of electrodes, an anode and a cathode.

2. The electroluminescent device of claim 1, further comprising a light emitting gallium complex is contiguous to a hole-transporting layer and an electron transporting layer with all layers placed between two electrodes.

3. The electroluminescent device of claim 1, further comprising two emissive layers with one layer containing the light emitting gallium complex.

4. The electroluminescent device of claim 1, further comprising two or more emissive layers to produce white light with at least one layer containing the light emitting gallium complex.

* * * * *